United States Patent

Duck, deceased

[15] 3,684,973

[45] Aug. 15, 1972

[54] CIRCUIT ARRANGEMENT FOR A DIFFERENCE AMPLIFIER IN INTEGRATED CONSTRUCTION

[72] Inventor: Wolfgang Duck, deceased, late of Wilramstrasse 13, 8000 Munich 80, Germany heir

[22] Filed: Aug. 26, 1970

[21] Appl. No.: 66,983

[30] Foreign Application Priority Data

Aug. 28, 1970 Germany..........P 19 44 027.8

[52] U.S. Cl...................330/30 R, 330/17, 330/30 R

[51] Int. Cl...............................................H03k 3/68

[58] Field of Search....330/13, 17, 30 D, 30 R, 38 M, 330/69, 18

[56] References Cited

UNITED STATES PATENTS 3,440,554 4/1969 McGraw et al..........330/30 D 3,541,465 11/1970 Nagata et al.............330/30 D

*Primary Examiner*—Roy Lake
*Assistant Examiner*—Lawrence J. Dahl
*Attorney*—Birch, Swindler, McKie & Beckett

[57] ABSTRACT

A monolithically integrated difference amplifier having closely adjacent transistors of equal geometrical form and substantially equal properties such that the collector currents in said transistors are equal when said difference amplifier is in a quiescent state is described. The output impedances of the transistors forming the difference amplifier are active impedances, preferably transistors connected in a common base configuration and having their bases connected in common. Coupling between the bases of the active impedance output circuits and the difference amplifier is accomplished by means of an auxiliary difference amplifier.

4 Claims, 2 Drawing Figures

CIRCUIT ARRANGEMENT FOR A DIFFERENCE AMPLIFIER IN INTEGRATED CONSTRUCTION

BACKGROUND OF THE INVENTION

This invention is related to difference amplifiers, and in particular to monolithically integrated difference amplifiers having transistors of substantially equal conduction properties physically closely adjacent to one another and of substantially the same geometrical form.

The basis for selection of amplifier circuits which can be used in constructing integrated semi-conductor circuits is determined by the galvanic coupling which is present, and an additional factor is that there must be insofar as possible, an absence of capacitive coupling. It is known that so called push-pull amplifiers have poor temperature stability characteristics. This arises out of the fact that the base-emitter path leakage voltage in transistors used in such amplifiers is strongly temperature dependent, and this voltage will be amplified by the operation of such amplifiers. It is for this reason that the well known difference amplifier circuit has achieved such wide use as a standard amplifier circuit in integrated circuit devices. The quality of such a difference amplifier and its usefulness for the aforementioned purpose is dependent on the symmetry between the active elements used to form a difference amplifier with respect to their physical behavior. In the case of difference amplifiers constructed of vacuum tubes double triodes were used for the reason that such tubes were manufactured using the same processes so that nearly the same physical properties, particularly conduction characteristics, could be realized.

Integrated circuit technology now affords the possibility of readily obtaining difference amplifiers having equal physical properties and conduction characteristics, because it is relatively simple to construct closely adjacent, monolithically integrated transistors of equal geometrical form having equal properties. A particularly useful integrated difference amplifier circuit has been found to be one where the output impedances of the transistors, e.g., the collector resistors, are replaced by active impedances, such as transistors. Using transistors for this purpose avoids the problem of having to provide a relatively high DC voltage to the ohmic resistors which are normally used. In constructing such circuits using integrated circuit technology the above described principle of equal element properties is again used. The use of active impedances in the output circuits of the transistors constituting the difference amplifier provides another advantage in that a push-push to push-pull conversion is carried out which is often desirable as the output signal from the amplifier is desired to be a single pole output relative to a fixed potential.

In those difference amplifiers where transistors are used as the active impedances in the output circuits of the transistors constituting the difference amplifier the active impedance transistors are connected in a common base configuration, and PNP transistors are generally used. The bases of the active impedance transistors are connected to a collector of one of the transistors forming the difference amplifier so that the base currents of the active impedance transistors are an important factor in the operation of the difference amplifier and may be the cause of asymmetry in the amplifier operation. This asymmetry may produce a spurious and undesired output signal when the amplifier is in a quiescent condition.

It is, therefore, an object of this invention to provide a circuit arrangement for a difference amplifier utilizing active impedances in the output circuits of the transistors constituting the amplifier a means which avoids the asymmetry which may result from this circuit configuration.

SUMMARY OF THE INVENTION

The aforementioned and other objects may be realized by constructing a difference amplifier according to the principles of this invention in which the control electrodes of the active impedances and the output circuits of the transistors constituting the difference amplifier are approached through an auxiliary difference amplifier.

DETAILED DESCRIPTION OF THE DRAWINGS

Figure 1:
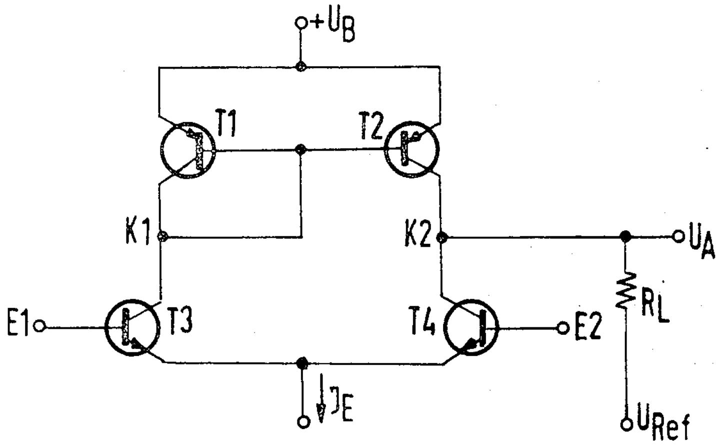
Fig. 1 PRIOR ART
FIG. 1 is a schematic diagram of a prior art difference amplifier circuit utilizing transistors as the collector circuit impedances in the transistors constituting the amplifier.

FIG. 1 illustrates a well known difference amplifier circuit for which the invention described and claimed herein provides an improvement. The difference amplifier in the FIG. 1 circuit comprises a pair of closely adjacent transistors T3 and T4. As shown in the Figure, these transistors are NPN transistors connected in a common emitter configuration with the emitters being connected to one another. The inputs to the difference amplifier consist of input terminals E1 and E2 which are connected, respectively, to the bases of transistors T3 and T4. A current $J_E$ flows through the emitter circuits of the amplifier, when the amplifier is in a quiescent condition, and in view of the common connection of the emitters it can be seen that the collector currents of both transistors will also be equal when the amplifier is quiescent.

The output impedances of the transistors T3 and T4, which normally will be collector resistors, are in this case active impedances with the conduction paths thereof forming parts of the collector circuits of transistors T3 and T4 and connecting same to a source of positive voltage $U_b$. In the embodiment shown in FIG. 1 these active impedances are transistors T1 and T2. It is contemplated that these transistors, as well as transistors T3 and T4, have substantially equal properties, because monolithic construction is used. Further, the transistors T1 and T2 in the monolithic construction arrangement will be physically closely adjacent and of substantially equal geometrical form. The transistors used for T1 and T2 are PNP transistors with the emitters thereof being connected together and to the voltage source $U_B$. The bases of T1 and T2 are connected together and to a point K1 in the collector circuit of the transistor T3. Thus, the collector current from transistor T3 will flow into the base circuits of T1 and T2. The difference amplifier's load impedance $R_L$ is connected at one end to a point K2 in the collector circuit of transistor T4, and the other end of the load impedance is connected to a reference voltage $U_{Ref}$. The output voltage of the amplifier is taken from a terminal $U_A$.

When the difference amplifier is in a quiescent state, a symmetry between the T3 and T4 branches will exist so that the collector current of the transistor T1 will be equal to the collector current of the transistor T2. In this case no current will flow through the load resistor $R_L$. However, if a signal is present at the input terminals of the difference amplifier the symmetry will be disturbed in the T3 branch increasing the emitter current therein. Because of the connected relationship of the emitters of T3 and T4, it is apparent that the current flowing in the emitter of T4 will have to be equal to that flowing in T3. In order for this to be the case there must then be a current flow through the load resistor $R_L$.

The aforementioned substantially ideal condition will only occur when the current amplification of the transistors T1 and T2 has a value in excess of 50. That is, when the aforementioned current amplification factor is present in the transistors T1 and T2, the base currents of the controlling and the controlled transistor are negligibly small so that the base currents of both of these transistors in this arrangement will not bring about an asymmetry at point K1.

In monolithically integrated circuit technology, however, the PNP transistors which are available for use in the above described circuit arrangement have a current amplification factor which is too low, i.e., less than 50. The base currents of both transistors, therefore, are of a magnitude which is not negligible and which is likely to cause an asymmetry at point K1. That is, with base currents for transistors T1 and T2 of too great a value the current flowing through point K1 will be not only the collector current of transistor T3, but will include a current comprising the sum of the collector current of transistor T3 and the base currents of the transistors T1 and T2. Because of this asymmetry, an undesirable output signal will result when the amplifier is in a quiescent condition.

In difference amplifier circuits constructed according to the principles of this invention the aforementioned undesirable base currents in the active impedance transistors can have no detrimental effect on the symmetry of the difference amplifier circuit. This effect is brought about by the insertion of an auxiliary difference amplifier coupling the bases of transistors T1 and T2 to the point K1 so that the current load at point K1 is decreased by the amplification factor of the auxiliary difference amplifier.

Figure 2:
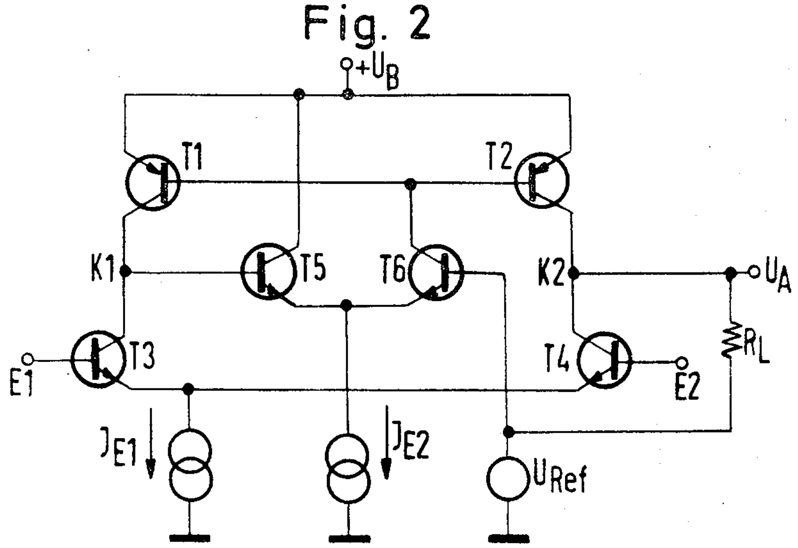
FIG. 2 is a schematic diagram of a preferred embodiment of a difference amplifier circuit constructed according to the principles of this invention.

Referring to FIG. 2 where a preferred embodiment of a difference amplifier constructed according to the principles of this invention is shown, as was the case in the FIG. 1 circuit, the difference amplifier comprises transistors T3 and T4 connected in the manner described in FIG. 1 with the difference inputs E1 and E2 being connected, respectively, to the bases of T3 and T4. The transistors T1 and T2 are connected in the same manner as with the FIG. 1 circuit, as is the load impedance $R_L$. Again, PNP transistors are, in this embodiment, used for the transistors T1 and T2. Both of the aforementioned transistor pairs are manufactured as monolithically integrated, closely adjacent transistors of equal geometrical form. As was the case in FIG. 1, a current $J_{E1}$ flows through the common-connected emitters of T3 and T4 so that the collector currents of these two transistors are equal.

The bases of transistors T1 and T2 are connected together, but they are approached over an auxiliary difference amplifier comprised of transistors T5 and T6. This auxiliary difference amplifier couples the bases of T1 and T2 to the point K1 in the collector of transistor T3. The emitters of T5 and T6 are connected to each other and in a common emitter configuration with a current $J_{E2}$ flowing therethrough. Thus, the collector currents in T5 and T6 will be equal. The base of transistor T6 is connected to a reference voltage and to the same reference voltage to which one end of the load resistor $R_L$ is connected, as described hereinabove with reference to FIG. 1. The base of transistor T5 is connected to K1.

In the known manner the current at K1 affects the symmetry of the auxiliary difference amplifier to control the current flow through T6 which supplies the base currents to transistors T1 and T2. In the quiescent state of the main difference amplifier, as was the case hereinabove, the collector currents of transistors T3 and T4 will be equal, and no current will flow through the load resistor $R_L$. However, if a signal appears at the terminals E1 and E2, then by reason of the forced symmetry conditions, a current will flow through the load resistor $R_L$ which generates an output signal at the terminal $U_A$. This output signal will literally correspond to the input signal of the difference amplifier.

The preferred embodiment of the invention described hereinabove is considered to be only exemplary, and it is contemplated that modifications and changes to the circuitry described may be made within the scope of the appended claims.

It is claimed:

1. In a difference amplifier comprising a pair of transistors forming parallel current paths and having like properties so that the collector currents therethrough are equal when said amplifier is in a quiescent condition and wherein the collector impedance of each said transistor is an active impedance having a control electrode, said control electrodes being coupled in common to the collector of one of said pair of transistors, the improvement comprising:

an auxiliary difference amplifier having an input connected to said collector of one of said pair of transistors and an output connected in common to said control electrodes.

2. The improved difference amplifier defined in claim 1, wherein said active impedances are a second pair of transistors wherein the conduction paths therethrough, respectively, form parts of the collector circuits of said pair of transistors, and the bases thereof constitute said control electrodes.

3. The improved difference amplifier defined in claim 2, wherein said pair of transistors are NPN transistors and said second pair of transistors are PNP transistors.

4. The improved difference amplifier defined in claim 1, wherein said auxiliary difference amplifier comprises a third pair of transistors forming parallel current paths connected in such a manner that the collector of one of said third pair of transistors supplies current to said control electrodes and the base of the other of said third pair of transistors is connected to the collector of one of said pair of transistors forming said difference amplifier.

* * * * *